United States Patent
Das et al.

(10) Patent No.: US 9,597,711 B2
(45) Date of Patent: Mar. 21, 2017

(54) METHOD AND APPARATUS FOR COMPONENTS REMOVAL

(75) Inventors: Pranamesh Das, Noida (IN); Nitin Gupta, Noida (IN); Khadak Singh, Noida (IN); Abdul Rehman, Noida (IN)

(73) Assignee: ATTERO RECYCLING PVT. LTD., Noida (IN)

( * ) Notice: Subject to any disclaimer, the term of this patent is extended or adjusted under 35 U.S.C. 154(b) by 337 days.

(21) Appl. No.: 14/111,568

(22) PCT Filed: Apr. 20, 2012

(86) PCT No.: PCT/IN2012/000288
§ 371 (c)(1),
(2), (4) Date: Mar. 24, 2014

(87) PCT Pub. No.: WO2012/143951
PCT Pub. Date: Oct. 26, 2012

(65) Prior Publication Data
US 2014/0251876 A1    Sep. 11, 2014

(30) Foreign Application Priority Data

Apr. 20, 2011  (IN) .......................... 1048/DEL/2011

(51) Int. Cl.
| | |
|---|---|
| B03B 9/06 | (2006.01) |
| B07B 1/46 | (2006.01) |
| B07B 1/28 | (2006.01) |
| H05K 13/04 | (2006.01) |

(52) U.S. Cl.
CPC ............... *B07B 1/46* (2013.01); *B07B 1/28* (2013.01); *H05K 13/0486* (2013.01)

(58) Field of Classification Search
CPC ........ B07B 1/28; B07B 1/46; H05K 13/0486; H05K 3/22; H05K 2203/178; B03B 1/02; B29B 17/02; B29B 2017/0255; B09B 5/00; C22B 7/004
USPC .............................. 209/3, 11, 397, 400, 401
See application file for complete search history.

(56) References Cited

U.S. PATENT DOCUMENTS

| | | |
|---|---|---|
| 4,874,486 A | 10/1989 | Hanulik |
| 5,683,040 A | 11/1997 | Jakob et al. |
| 5,758,817 A * | 6/1998 | Chapman ..................... 228/264 |
| 6,234,317 B1 | 5/2001 | Sommer |

* cited by examiner

*Primary Examiner* — Joseph C Rodriguez
*Assistant Examiner* — Kalyanavenkateshware Kumar

(57) ABSTRACT

The proposed invention relates to an apparatus and a method of separating all the parts including but not limited to electronic components, mechanical components, and electromechanical components, modules etc either individually or in sections and modular parts from the main input PCB. The proposed invention is an apparatus and method for component removal during recycling of an electronic device comprising in combination an isothermal system; heating to achieve desired range of temperature within the said isothermal system; at least one system for mechanical handling of the object being recycled; at least one system for selective separation of components being removed.

6 Claims, 7 Drawing Sheets

METHOD AND APPARATUS FOR COMPONENTS REMOVAL

FIELD OF THE INVENTION

The invention relates to an apparatus and a method of separating the individual components that are there in any Printer Circuit Board (PCB). More specifically, this invention relates to a complex method of separation of the disparate mixture of components including electronic, metallic, non metallic and mechanical components that are either soldered in the PCB or mechanically attached to the PCB, by a specialized selection of multiple separation mechanisms including physical, shape and material property based means and an apparatus thereof.

BACKGROUND OF THE INVENTION

Electronic Waste, or e-waste as it is commonly known now, is fast becoming a dominant factor contributing towards polluting the earth in all its physical forms i.e. air, soil and water. World over there is a concerted effort being put to reduce, reuse and recycle (preferably in that order) the electronic devices that have reached an end-of-life of their intended purpose or market. Towards this effort, the governments of various developed and developing countries as well as commercial interest groups are actively involved in developing policies and technologies that can efficiently address this problem and generate resources from e-waste such that it becomes an economically viable model for all.

From a recycling perspective of handling e-waste, most e-waste recyclers use manual, physical or chemical or a combination of all three to extract precious, rare-earth and industrial metals as well as non-metals like PVC, plastic, paper, glass, oil, fuel etc.

Printed Circuit Boards, or PCB as commonly known are one of the most harmful parts that constitute to anywhere from 10% to 60% of any electronic device. If dumped in landfill or processed in non environmental friendly methods, they constitute bulk of the polluting matter in any electronic device by volume or weight.

Since electronic waste recycling is the exact opposite of the process of electronic manufacturing as a process, there cannot be any control on the quantity, shape, size, and type of material of the input. This makes the processing of the PCB very particularly difficult especially with respect to separation of the individual components on it. The various components on the PCB are firmly fixed to the copper pads of the PCB either by soldering it directly or mechanically fixing it to the PCB.

In some of the currently prevailing methods of handling e-waste, the whole of the PCB is processed together. While this process of metal extraction may be acceptable in current circumstances, the recovery efficiency is very limited because of the mixed nature of the PCB and its components.

U.S. Pat. No. 4,874,486 describes process of recycling of electrical batteries, assembled printed circuit boards and electric components. The process comprises heating of the whole PCB as such at very high temperature and then chemically processing the molten slag. The disadvantages of the process include low efficiency due to less recovery of precious metals. Further, the recovered metals are highly impure and cannot be utilized for making standard quality product again.

U.S. Pat. No. 5,683,040 teaches method for recycling waste from PCB assemblies. The process involves of removal of contaminants from PCB, mechanically pre comminuting the PCB to obtain particles of size not more than 30 mm and then cryogenically embritting the particles thus selected. The main drawback of the process is that only components being able to be recycled are those having size less than 30 mm and hence limiting the scope of applicability and limiting the recyclability of complete PCB.

U.S. Pat. No. 6,234,317 discloses device for sorting raw, pretreated or recycled bulk material. The device is of lesser utility in recycling purpose as the main function of component removal from PCB has to be performed separately.

In order to overcome some of the limitations, one of the ways is to put everything, irrespective of the differences in shape, size, and type of material, into a specialized smelter and separate the metals by parts by smelting in lead, copper, silver etc. However this process requires a large furnace, large smelter and large quantity of raw materials to feed its process continuously for it to be economically viable. In this process it also impossible to recover any item on the PCB that can be reusable.

The PCB contains a multitude of metals in the form of building material for electronic parts and components. Each of these metals has different physical and chemical properties. For example, they have different melting points, different physical structure and different reactions to chemicals. As they react differently to chemicals and can also form alloys for the purpose of the electronic component. Therefore any one process for separation does not yield the best results.

In order to resolve this and as an alternative, this invention provides a method and apparatus for preprocessing of the boards and removal of all the components and then separating them into broad categories and processing each type by a more efficient method to do a better recovery irrespective of the quantity because the metal recovery can be targeted based on the known chemical content and physical profiles of component material and the yields can be significantly higher. The other advantage to this invention is to recover many reusable parts from the PCB that can be used as-it-is without any effect on the individual usability specifications of the recovered items.

OBJECT OF THE INVENTION

The main object of the present invention is to separate the individual components from any Printed Circuit Board.

Yet another object of the invention is to provide a cost effective method for separating individual components from PCB.

Yet another object of the invention is to provide a unique apparatus for separating individual components from PCB.

Yet another object of the invention is to perform the component removal process more efficiently and in a unique way.

Yet another object of the invention is to simplify the process of recycling of e-waste.

Yet another object of the invention is to obviate the limitation of requirement of bulk recycling equipments to achieve cost effective economically viable e-waste recycling process.

Yet another object of the present invention is to addresses the efficiency aspect of recycling process, by separating the components and segregating them into specific groups based on their metal composition.

Yet another object of the invention is to obviate the above cited disadvantages of the state of the art and to provide an enhanced and efficient process of dismantling and dislodging of components of electronic devices.

SUMMARY OF THE INVENTION

Accordingly, the proposed invention relates to an apparatus and a method of separating all the parts including but not limited to electronic components, mechanical components, and electromechanical components, modules etc either individually or in sections and modular parts from the main input PCB.

The components on a PCB are typically fixed to the PCB using solder as well as mechanical fixtures including, but not limited to, through mechanical connectors, hinges, clips, screws, pinups, bent flanges, or magnetic holders etc. It is quite apparent that—no single method can be made applicable to remove all the items from the board (PCB).

For separating the components from the PCB that are soldered to it directly, we need to do large area disordering in an isothermal environment such that the there is some chance of recovering reusable components as well as other mechanical parts while separating the components from the base PCB without damaging the component or its functionality.

For separating any components that are fixed by means of mechanical fixtures, they have to be separated physically using a mix of automatic methods as well as manual methods.

DESCRIPTION OF THE DRAWINGS

The various features, advantages and other uses of the present e-waste recycling method and apparatus will become more apparent by referring to the following detailed description and drawings in which.

EMBODIMENTS

Figure 1:
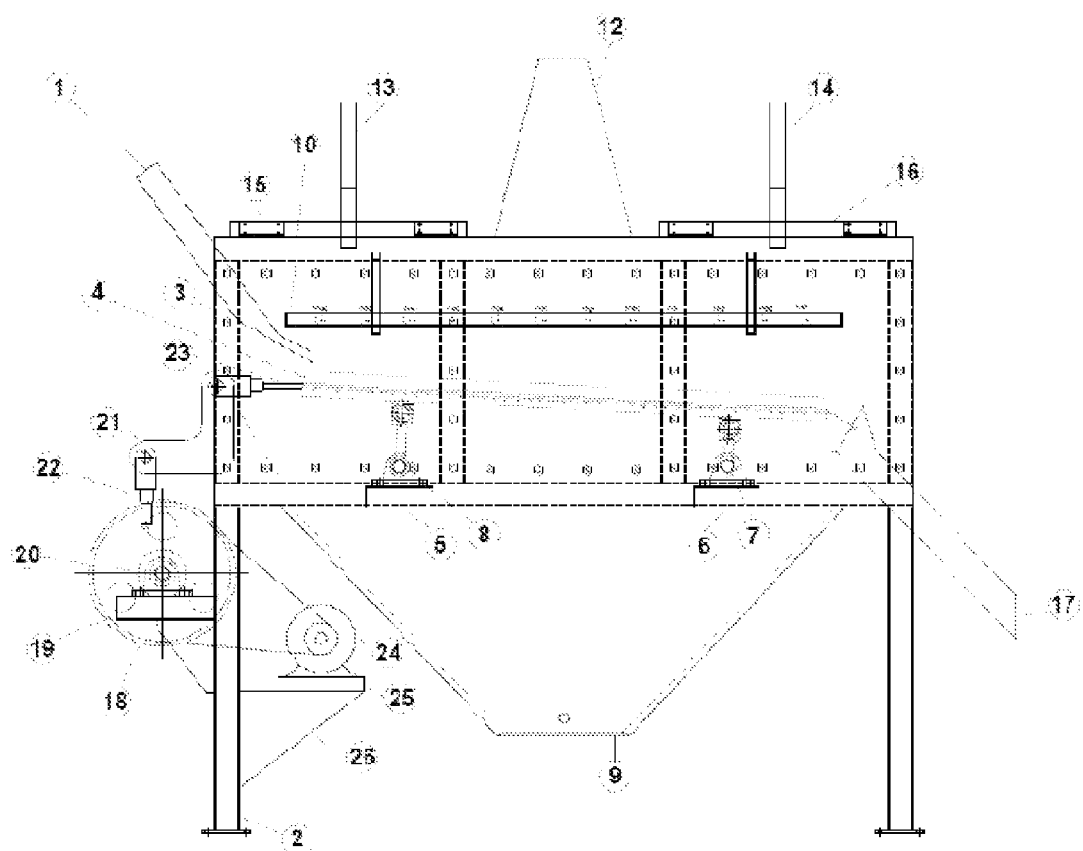
FIG. 1 is a schematic diagram of a general assembly of component removal equipment layout.
Figure 1A:
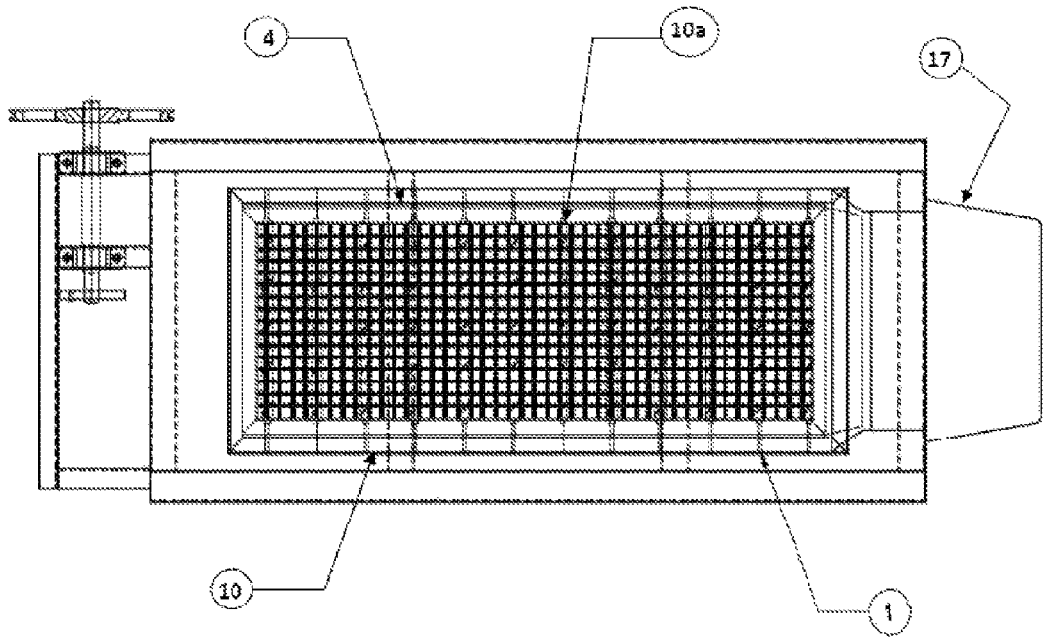
FIG. 1A is the major components of the equipment layout.
Figure 2:
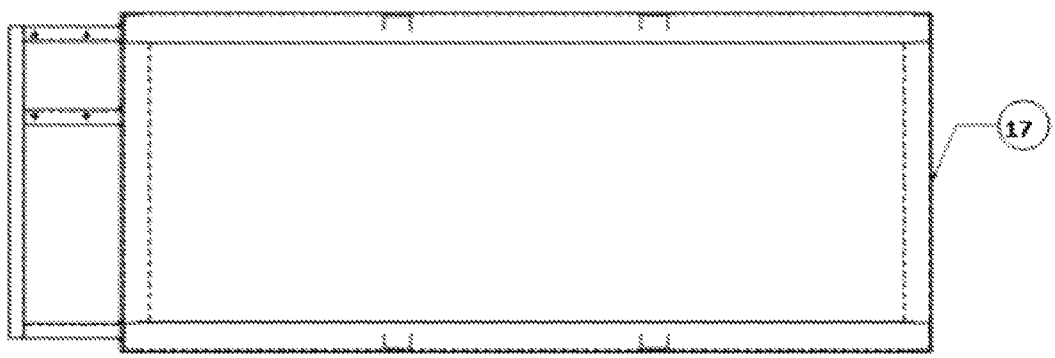
FIGS. 2, 2A & 2B depict the outer frame in various views of the component removal equipment.
Figure 2A:
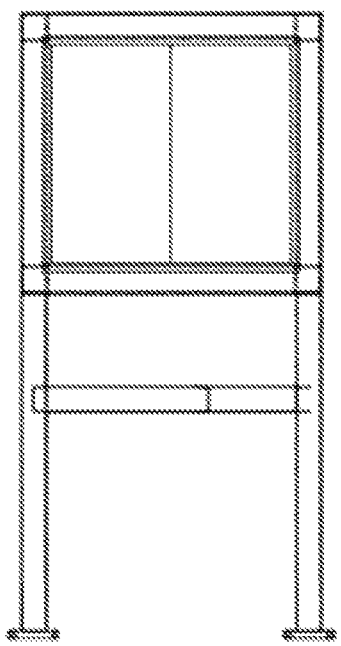
Figure 2B:
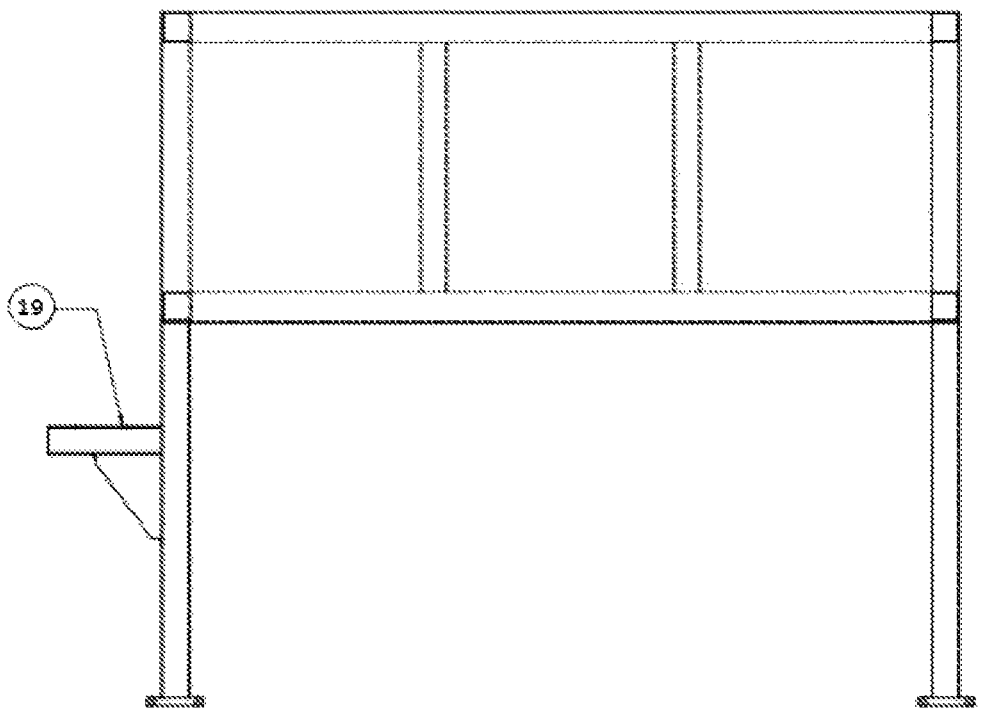
Figure 3:
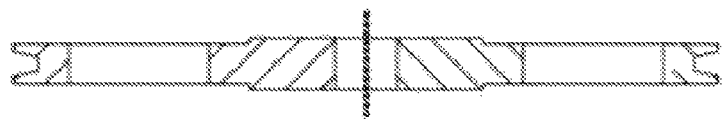
FIG. 3 shows pulley of main assembly disassembled.
Figure 4:
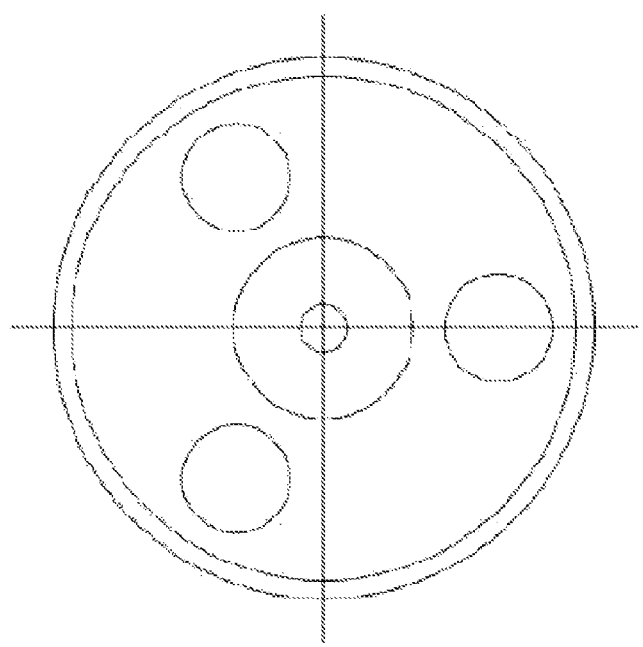
FIG. 4 shows general arrangement of the pulley.
Figure 5:
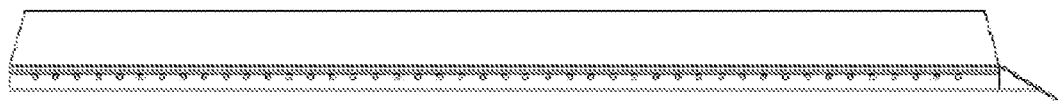
FIG. 5 shows side view of mesh frame of main assembly disassembled.
Figure 5A:
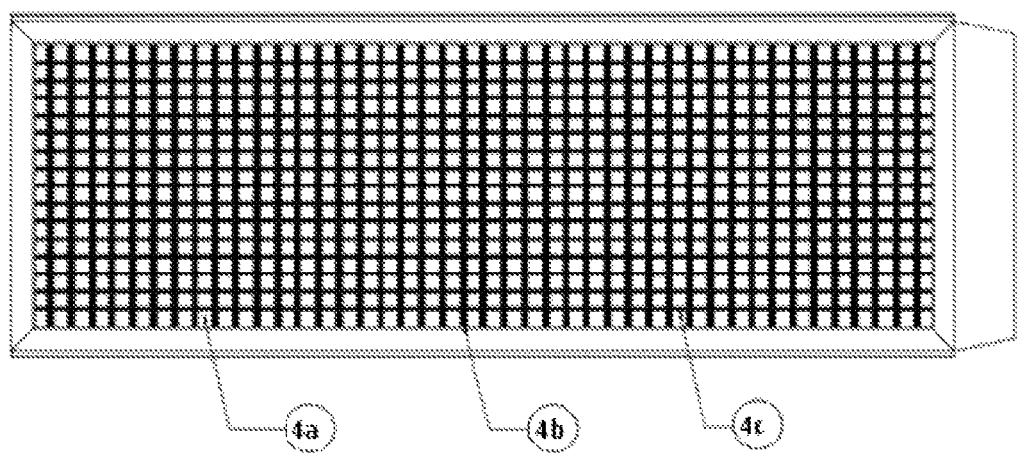
FIG. 5A shows detailed top view of mesh frame of main assembly disassembled wherein empty space [4a] and mesh wires [4b and 4c] are shown.
Figure 6:
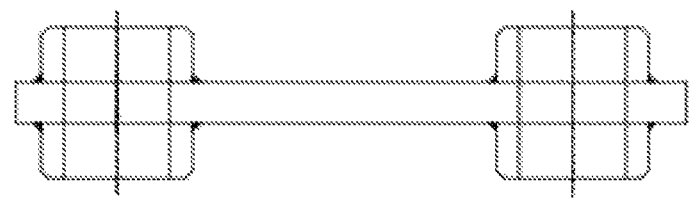
FIG. 6 shows lever of main assembly disassembled.
Figure 6A:
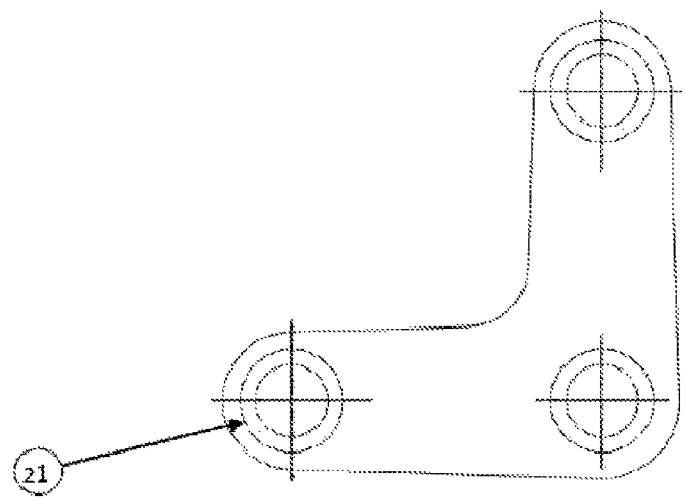
FIG. 6A shows another view of lever of main assembly disassembled.
Figure 7:
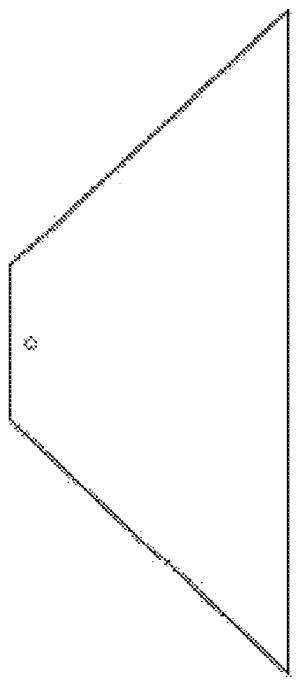
FIGS. 7, 7A & 7B show different views of hood of main assembly disassembled.
Figure 7A:
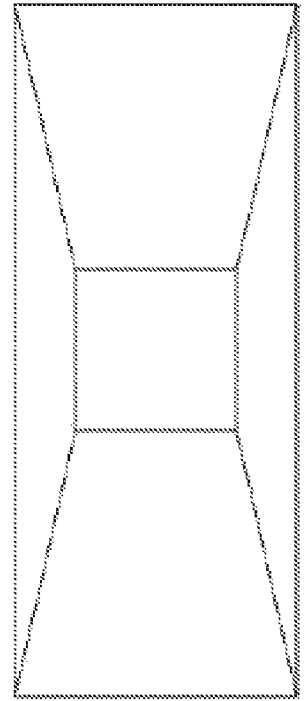
Figure 7B:
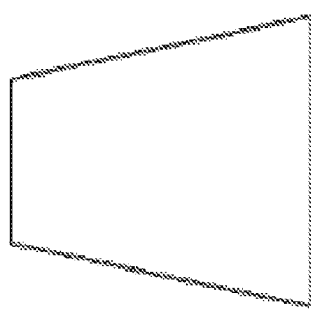
Figure 8:
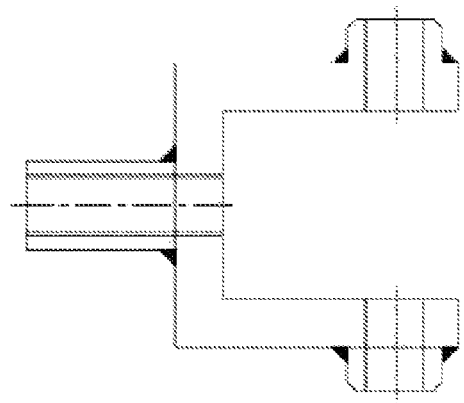
FIG. 8 shows hinge rod of main assembly disassembled.
Figure 9:
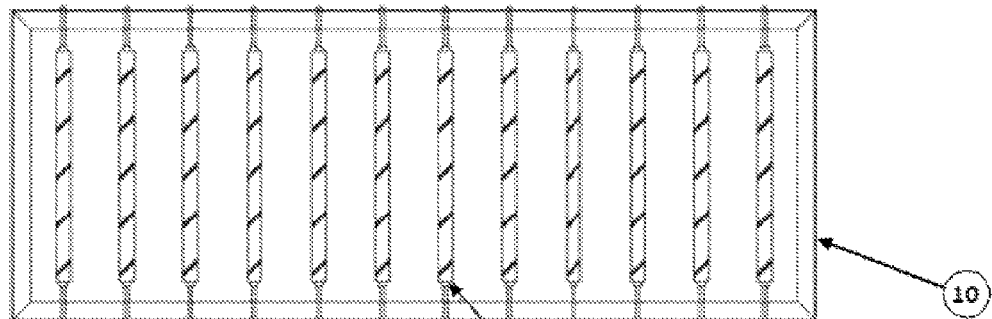
FIG. 9 shows top view of heater element frame arrangement wherein frame [10], and heating elements/components [10a] are shown.
Figure 9A:
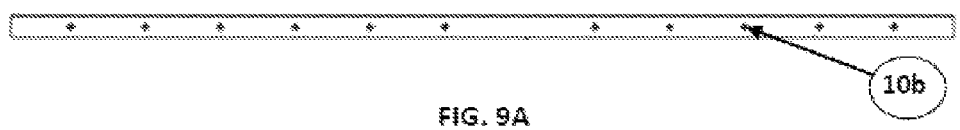
FIG. 9A shows side view of frame arrangement wherein attachment [10b] of frame and heating element is shown.
Figure 9B:
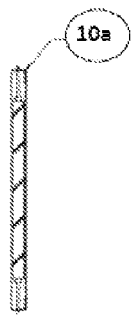
FIG. 9B shows heating element [10c] disassembled from heating frame.

Accordingly, the preferred embodiment of the proposed invention is an apparatus for component removal during recycling of an electronic device comprising in combination an isothermal system; at last one inlet to the said isothermal system; at least one means for heating to achieve desired range of temperature within the said isothermal system; at least one system for mechanical handling of the object being recycled; at least one system for selective separation of components being removed; at least one system for enabling uninterrupted movement of the said object being recycled; at least one system for flipping the object being recycled upside down during processing in the said isothermal system; a conveyor system; and at least one outlet.

In another embodiment of the proposed invention the said means for heating comprises plurality of heating rods [10a].

In still another embodiment of the proposed invention the said system for mechanical handling of the object being recycled comprises gravity effect in combination with vibration system by virtue of pulley [18] and lever [20] system.

In still another embodiment of the proposed invention the said system for selective separation of components being removed comprises mesh table [4] allowing the components separated from the said object to drop down through the mesh.

In yet another embodiment of the proposed invention the said system for enabling uninterrupted movement of the said object being recycled comprises slant or inclined platform arrangement of mesh table [4].

In yet another embodiment of the proposed invention the said means for heating is so arranged in the said apparatus that the resultant distance of the heating rods [10a] from the said object being recycled on the mesh table [4] is in the range of 5-15 centimeter.

In yet another embodiment of the proposed invention the said conveyor system enables the said object being recycled to enter the said isothermal system and further enables the separated Printed Circuit Board and components be conveyed for further processing from the said outlet.

In yet another embodiment of the proposed invention the said system for flipping the object being recycled enables components of both sides of the said object to be removed;

In yet another embodiment of the proposed invention the said conveyor system comprises specialized conveyor means for resisting high temperature and enabling the said object being recycled to be conveyed from the inlet of the said isothermal system through the said system and further conveyance of the separated Printed Circuit Board and components for further processing from the said outlet.

In another preferred embodiment of the present invention is proposed a process for removal of components during recycling of an electronic device comprising the steps of heating the said device being recycled at a desired temperature in an isothermal chamber; removing mechanically the dislodged components under the effect of gravity; and separating the said dislodged components on the basis of parameters including but not limited to size, shape, weight, density, melting points, or physical properties known in the state of the art.

In another embodiment of the proposed invention the said temperature desired for heating is in the range of 180-400 degree centigrade.

In another embodiment of the proposed invention the said dislodged components are removed mechanically under the effect of mechanical movement like vibration and gravity.

DETAILED DESCRIPTION OF THE INVENTION

This invention relates to an apparatus and a method of separating all the parts including but not limited to electronic components, mechanical components, and electromechanical components, modules etc either individually or in sections and modular parts from the main input PCB.

The components on a PCB are typically fixed to the PCB using solder as well as mechanical fixtures including, but not limited to, through mechanical connectors, hinges, clips, screws, pinups, bent flanges, or magnetic holders etc. It is quite apparent that there no single method can be made applicable to remove all the items from the board (PCB).

For separating the components from the PCB that are soldered to it directly, we need to do large area disordering in an isothermal environment such that the there is some chance of recovering reusable components as well as other mechanical parts while separating the components from the base PCB.

For separating any components that are fixed by means of mechanical fixtures, they have to be separated physically using automatic methods as well as manual methods.

The PCBs with all the components are first inspected and broadly categorized. The classification could be based on the following parameters PCB area (including shape)
Component area to PCB area ratio
PCB type (SMD, high density, single layer, multi layer, RF)
Component Density
Component Type
Track and Pad type
PCB surface treatment type The above broadly defines the metal content of the PCB and there by its commercial value and the most optimum processing for the same.

Each of the defined groups has a different metal content and each needs to be processed separately for maximizing the metal recovery output. This type of segregation is done based on automatic selection of PCB based on size and further selections based on the other parameters manually. To do this, each bunch of mixed PCBs are lined up and put in a conveyer where there are people and electromechanical vision based systems separate the individual populated boards into the broad categories as described above. The electromechanical separation process first separates the boards based on the different broad categories of size. Thereafter the boards are separate based on the presumed metal content on a visual inspection of the components.

As shown in FIG. 1, these segregated boards then go through a second level of processing where if there are any modules on the board that are fixed purely based on simple hooks, clips or springs etc to small modules they are removed and kept separate. This is important because the mechanically fixed components do not effectively separate from the PCB in the Component Removal Machine, CRM.

The general assembly as shown in FIG. 1 shows Inlet Tray [1] to feed in electronic components for segregation; Stand [2] for supporting the load of machine; Body frame [3] enclosing casing structure for the machine; Mesh table [4] having vibrating structure operating at a specified frequency to segregate components; Mesh table stand [5, 6] for providing support to the mesh table; Mesh Table [7, 8] Bearing component used for separating movable part of the mesh table and sustains high load; Collection Hopper [9] to collect the segregated components; Heating rods Stands [10] for holding plurality of vertical heating rods [10a] operating at a desired temperature to heat the chamber; Exhaust Vent [12] Outlet of hot exhaust gases and dust & having a provision to connect with Air Pollution Control System; Maintenance Support Beam [13, 14] holds the maintenance hood and can be removed when machine undergoes periodic maintenance; Maintenance Hood Removable covers [15, 16] for carrying out maintenance and repair work; Outlet Tray [17] to collect the desired component once it is segregated; Pulley [18] to make the mesh table vibrate at desired frequency; Pulley Support [19] Holds the suspended pulley assembly; Lever [20] to lift the loaded weight; Hinge [21] Bearing allowing limited rotation; Horizontal Hinge Connecting Rod [22] Holding the rod in a horizontal position; Vertical Hinge Connecting Rod [23] Holding the rod in a vertical position; Electric Motor [24] For converting mechanical energy to electrical energy; Electric Motor Platform [25] acts as a base for the motor; V-Belt [26] For supporting electric motor.

The separated boards are fed into a complex conveyor belts that feed them to an isothermal chamber. The complex conveyer system makes sure that on a multitude of CRM setups, each board is equally fed into the system one after the other, in a serial order, with the component side facing down. This isothermal chamber is heated up to from 190 to 365 degree centigrade depending on the type of board as per below table

TABLE 1

| S. No. | Board Type | Temperature |
|---|---|---|
| 1 | Pb (leaded) board | 190 |
| 2 | Pb Free (Lead Free) | 365 |

The heating inside the chamber is done by use of plurality electric heating rods. For example, we can use Nicrome wire on ceramic rods or ceramic heaters. These rods are arranged in rows above the PCB board at a height in range of 5-20 cm from the board, preferably about 10 cm. This distance of the electric board from the heating rods is optimum, where by the components do not get burned but the solder gets melted.

The optimum temperature is maintained by use of a temperature sensor inside the isothermal chamber located near the PCB Loading mesh and by use of a closed loop system with the heaters.

When the board is fed inside the isothermal chamber; based on the above board type, the solder melts. When the solder melts, most of the components on the board get dislodged. However sometimes, due to surface tension, the components stick to the PCB. Therefore they need to be removed by vibrating the board at a pre determined frequency.

The boards being put inside the chamber can be held either vertically or horizontally depending on the board type. For example in one embodiment, the boards are kept on a mesh platform inside the isothermal chamber. The platform is slanted in orientation at 5 to 10 degrees from entry towards the exit. This makes it possible for the boards to move continuously from the entry to exit points in the chamber without the need of any conveyor. This is specifically done to obviate the requirement of specialized high temperature conveyor system inside the chamber to move the board as the temperature of the chamber is very high.

Based on empirical results, when the solder melts after a predetermined time, the board is passed through a mechanical vibration system whereby the board with the melted solder is vibrated vigorously. This vigorous vibration results in the dislodging of all the components that are connected to the board using solder. These components get collected at the bottom of a funnel hoper and are fed to other systems for further processing. The vibration action is created by the mechanical placement of a specialized hinge rod, Lever and Pulley in a combination of interconnections. The pulley is driven by an AC motor, which in turn drives the lever which is connected to the hinge which moves the mesh platform on which the board is placed.

On another implantation, for double sided boards, within the chamber a specialized conveyer system is put, the boards are fixed on a base frame of aluminum so that the frame's internal sizing can accommodate various kinds of different boards while the outer sizing can be fixed on the conveyer in a uniform way.

Depending on the board's component placement, the boards fed into the chamber using different frames which change the orientation of the boards inside the chamber. For example if the boards have both side filled with components, then they are made to face downward first and then flipped upside down inside the chamber so that the vibration mesh platform can dislodge components on both the sides and the components drop at the bottom easily or even by gravity as the case may be.

In another case the boards have both sides with surface mount components, and then they are held vertically so that the heating effect can work on both sides of the board. When they move through the vibration portion of the heated chamber, they easily fall off.

If there are components that are "through hole" type, then they are put in a special frame whereby they are first heated with one side facing downward and vibrated and then they the other side is flipped over and vibrated again to remove the components on the other side.

Depending on the board type and the density of components on the board, the conveyer speed is selected for the best output.

After the components are removed, the bare boards devoid of the components are pushed out through another opening at the opposite end of the chamber.

It may be possible that certain large size components are still stuck with the board. There are separate removed by a combination of heating (to melt the remaining solder) and mechanically separating the loosened components while the solder is still in melted condition.

The heating inside chamber is effected by a mix of convection and radiation heating mix emanating from the heating source.

The temperature inside the chamber is controlled by careful placement of thermocouples at various places across the different sections.

The temperature inside the chamber is controlled by careful placement of thermocouples at various places across the different sections.

Within the chamber there are air curtains at the input area, output area and the bare board outlet in order ensure that the heated air is does not escape out. There is a hood arrangement at the top of the machine which at predefined time intervals, suck the heated air so that there is no collection any polluting gases. The air thus sucked, is fed into a scrubber to clean the air which is fed back into the chamber.

The outer cover of the chamber itself is filled with thermo resistant material so that the heat inside does not escape out.

It will thus be seen that the objects set forth above, among those made apparent from the preceding description, are efficiently attained and, since certain changes may be made in carrying out the above method and in the construction set forth without departing from the spirit and scope of the invention is intended that all matter contained in the above description and shown in the accompanying drawings shall be interpreted as illustrated and not in a limiting sense.

It is also to be understood that the following claims are intended to cover all of the generic and specific features of the invention herein described and all statements of the scope of the invention in which, as a matter of language might be said to fall there between.

We claim:

1. An apparatus for component removal during recycling of an electronic device comprising in combination:
   a. an isothermal system;
   b. at least one inlet to the said isothermal system;
   c. at least one means for heating to achieve desired range of temperature within the said isothermal system;
   d. at least one system for mechanical handling of the object being recycled;
   e. at least one system for selective separation of components being removed;
   f. at least one system for enabling uninterrupted movement of the said object being recycled;
   g. a conveyor system; and
   h. at least one outlet;
   wherein, the said means for heating comprises plurality of heating sources [10a];
   the said system for mechanical handling of the object being recycled comprises gravity effect in combination with vibration system by virtue of pulley [18] and lever [20] system;
   the said system for selective separation of components being removed comprises mesh table [4] allowing the components separated from the said object to drop down through the mesh;
   the said system for enabling uninterrupted movement of the said object being recycled comprises slant or Inclined platform arrangement of mesh table [4];
   the said means for heating is so arranged in the said apparatus that the resultant distance of the heating rods [10a] from the said object being recycled on the mesh table [4] is in the range of 5-15 centimeter; and
   the said conveyor system enables the said object being recycled to enter the said isothermal system and further enables the separated Printed Circuit Board and components be conveyed for further processing from the said outlet.

2. The apparatus for component removal as claimed in claim 1, wherein the desired range of temperature is 180-400 degree centigrade.

3. The apparatus for component removal as claimed in claim 1, wherein the selective separation of the dislodged components is on the basis of parameters including but not limited to size, shape, weight, density, melting points, or physical properties known in the state of the art.

4. An apparatus for component removal during recycling of an electronic device comprising in combination:
   a. an isothermal system;
   b. at least one inlet to the said isothermal system;
   c. at least one means for heating to achieve desired range of temperature within the said isothermal system;
   d. at least one system for mechanical handling of the object being recycled;
   e. at least one system for selective separation of components being removed;
   f. at least one system for flipping the object being recycled upside down during processing in the said isothermal system;
   g. a conveyor system; and
   h. at least one outlet;
   wherein,
   the said means for heating comprises plurality of heating rods [10a];

the said system for mechanical handling of the object being recycled comprises gravity effect in combination with vibration system by virtue of pulley [18] and lever [20] system;

the said system for selective separation of components being removed comprises mesh table [4] allowing the components separated from the said object to drop down through the mesh;

the said system for flipping the object being recycled enables components of both sides of the said object to be removed;

the said means for heating is so arranged in the said apparatus that the resultant distance of the heating rods [10a] from the said object being recycled on the mesh table [4] is in the range of 5-15 centimeter; and the said conveyor system comprises specialized conveyor means for resisting high temperature and enabling the said object being recycled to be conveyed from the inlet of the said isothermal system through the said system and further conveyance of the separated Printed Circuit Board and components for further processing from the said outlet.

5. The apparatus for component removal as claimed in claim 4, wherein the desired range of temperature is 180-400 degree centigrade.

6. The apparatus for component removal as claimed in claim 4, wherein the selective separation of the dislodged components is on the basis of parameters including but not limited to size, shape, weight, density, melting points, or physical properties known in the state of the art.

\* \* \* \* \*